(12) United States Patent
Shifren et al.

(10) Patent No.: US 10,454,026 B2
(45) Date of Patent: Oct. 22, 2019

(54) CONTROLLING DOPANT CONCENTRATION IN CORRELATED ELECTRON MATERIALS

(71) Applicant: ARM Ltd., Cambridge (GB)

(72) Inventors: Lucian Shifren, San Jose, CA (US); Kimberly Gay Reid, Austin, TX (US); Gregory Munson Yeric, Austin, TX (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/370,168

(22) Filed: Dec. 6, 2016

(65) Prior Publication Data
US 2018/0159028 A1 Jun. 7, 2018

(51) Int. Cl.
*H01L 45/00* (2006.01)
(52) U.S. Cl.
CPC .......... *H01L 45/12* (2013.01); *H01L 45/04* (2013.01); *H01L 45/1233* (2013.01); *H01L 45/14* (2013.01); *H01L 45/146* (2013.01); *H01L 45/16* (2013.01); *H01L 45/1608* (2013.01); *H01L 45/1658* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 8,223,539 | B2 * | 7/2012 | Smythe ............... H01L 45/145 365/148 |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 2003/0227047 | A1 * | 12/2003 | Hsu ....................... H01L 27/115 257/314 |

(Continued)

FOREIGN PATENT DOCUMENTS

WO 2008058264 A2 5/2008

OTHER PUBLICATIONS

International Preliminary Report on Patentability (Chapter 1 of the Cooperation Treaty), dated Jun. 20, 2018, International Application No. PCT/GB2017/053670, 1 pg.

(Continued)

*Primary Examiner* — Nishath Yasmeen
(74) *Attorney, Agent, or Firm* — Berkeley Law & Technology Group, LLP

(57) ABSTRACT

Subject matter disclosed herein may relate to fabrication of a correlated electron material (CEM) device. In embodiments, after formation of the one or more CEM traces, a spacer may be deposited in contact with the one or more CEM traces. The spacer may operate to control an atomic concentration of dopant within the one or more CEM traces by replenishing dopant that may be lost during subsequent processing and/or by forming a seal to reduce further loss of dopant from the one or more CEM traces.

18 Claims, 4 Drawing Sheets

(56) References Cited

U.S. PATENT DOCUMENTS

| | | | |
|---|---|---|---|
| 2006/0125122 A1* | 6/2006 | Roizin | B82Y 10/00 257/377 |
| 2008/0106926 A1 | 5/2008 | Brubaker | |
| 2008/0107801 A1 | 5/2008 | Celinska et al. | |
| 2009/0102598 A1* | 4/2009 | Yamazaki | H01L 45/04 338/20 |
| 2010/0314602 A1 | 12/2010 | Takano et al. | |
| 2012/0270393 A1 | 10/2012 | Pore et al. | |
| 2013/0009128 A1* | 1/2013 | Ribeiro | H01L 27/2463 257/9 |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2014/0353729 A1* | 12/2014 | Kao | H01L 21/823456 257/288 |
| 2016/0163978 A1 | 6/2016 | Paz De Araujo et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

OTHER PUBLICATIONS

International Preliminary Report on Patentability, dateded Jun. 20, 2018, International Application No. PCT/GB2017/053670, 9 pgs.

Notification of Transmittal of the International Search Report and the Written Opinion of the international Searching Authority, or the Declaration, App. No. PCT/GB2017/053670, Filed Dec. 5, 2017, dated Mar. 7, 2018, 18 Pages.

Communication Pursuant to Rules 161(1) and 162 EPC, Application No. EP17825276.3, dated Jul. 12, 2019, 3 Pages.

Notification concerning Transmittal of International Preliminary Report on Patentability (Chapter 1 of the Patent Cooperation Treaty), dated Jun. 20, 2018, International Application No. PCT/GB2017/053670, 1 pg.

International Preliminary Report on Patentability, dated Jun. 20, 2018, International Application No. PCT/ GB2017/053670, 9 pgs.

Notification of Transmittal of the International Search Report and the Written Opinion of the international Searching Authority, or the Declaration, App. No. PCT/GB2017/053670, Filed Dec. 5, 2017, Mailed Mar. 7, 2018, 18 Pages.

Janod; et al, "Resistive Switching in Mott Insulators and Correlated Systems," Advanced Functional Materials; vol. 25, No. 40, Oct. 1, 2015, pp. 6287-6305.

* cited by examiner

US 10,454,026 B2

CONTROLLING DOPANT CONCENTRATION IN CORRELATED ELECTRON MATERIALS

BACKGROUND

Field

This disclosure relates to correlated electron devices, and may relate, more particularly, to approaches for fabricating correlated electron devices, such as may be used in switches, memory circuits, and so forth, which may exhibit desirable impedance switching characteristics.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed.

However, conventional fabrication techniques, which may be well suited for certain types of memory and/or logic devices, may not be suitable for use in fabricating devices that utilize correlated electron materials. For example, in some instances, a correlated electron material (CEM) exhibiting desirable electrical characteristics may be doped with a particular dopant species. However, processing steps occurring after doping of a CEM may give rise to a loss of dopant within the CEM, which may adversely impact performance of one or more devices formed from a CEM.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
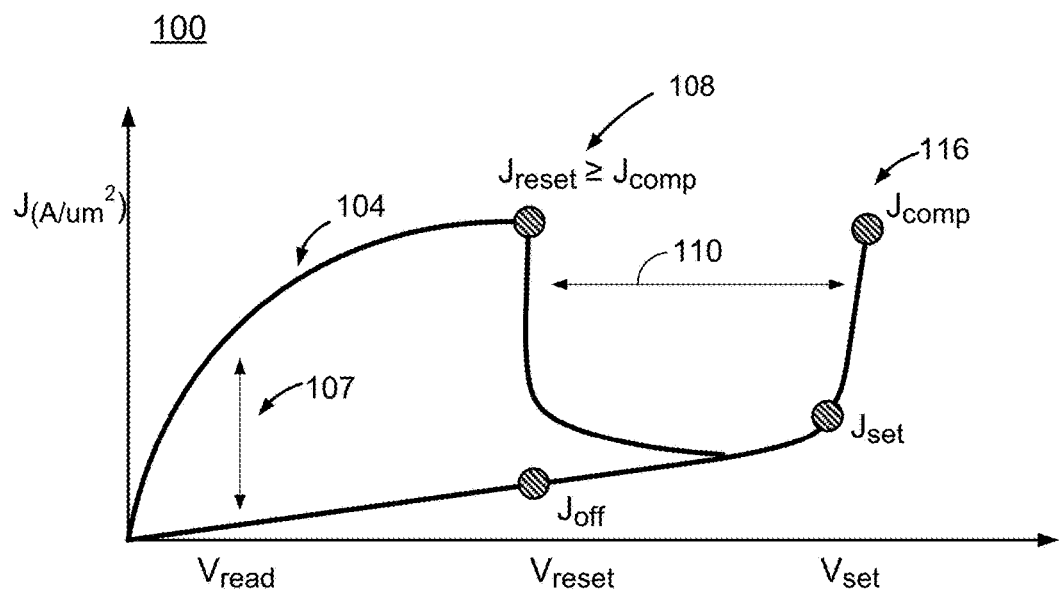
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition.

In implementations, a CEM may comprise one or more "d-block" elements from of the periodic table of the elements, such as transition metals, transition metal compounds, one or more transition metal oxides (TMOs), for example. CEM devices may also be implemented utilizing one or more "f-block" elements of the periodic table of the elements, such as rare earth elements, oxides of rare earth elements, oxides comprising one or more rare earth transitional metals, perovskites, yttrium, and/or ytterbium, or any other compounds comprising metals from the lanthanide or actinide series of the periodic table of the elements, for example, and claimed subject matter is not limited in scope in this respect. Accordingly, in embodiments, a CEM may comprise an atomic concentration of at least 85.0% of a d-block element or an f-block element from the periodic table of the elements. Accordingly, in addition to a d-block element or an f-block element, a CEM may comprise a dopant, such as a carbon-containing dopant and/or a nitrogen-containing dopant, in an atomic concentration of, for example, 0.1% up to 15.0%. Thus, in this context, as the term is used herein, a "d-block" element means an element comprising Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. Also in this context, a CEM formed from or comprising an "f-block" element of the periodic table of the elements means a CEM comprising a metal or metal oxide from f-block of the periodic table of the elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or into a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any d-block or f-block material from the periodic table of the elements. In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM may be more conductive in a low-impedance state. Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S), and others.

In this context, a "P-type" doped CEM as referred to herein means a first type of CEM comprising a particular molecular dopant that exhibits increased electrical conductivity, relative to an undoped CEM, if the CEM is operated in a low-impedance state. Introduction of a substitutional ligand, such as CO and $NH_3$, may operate to enhance the P-type nature of a NiO CEM. Accordingly, an attribute of P-type operation of a CEM may include, at least in particular embodiments, an ability to tailor or customize electrical conductivity of a CEM, operated in a low-impedance state, by controlling an atomic concentration of a P-type dopant in a CEM. In particular embodiments, an increased atomic concentration of a P-type dopant may bring about increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper slope (e.g., higher conductivity) of region 104.

In another embodiment, the CEM device of FIG. 1A may comprise other transition metal oxide variable impedance materials, such as nitrogen-containing ligands, though it should be understood that these are exemplary only and are not intended to limit claimed subject matter. NiO, for example, may be doped with extrinsic nitrogen-containing ligands, which may stabilize variable impedance properties in a manner similar to stabilization of variable impedance properties brought about by use of a carbon-containing dopant species (e.g., carbonyl). In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano (CN), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively low-impedance state, which may determine a compliance condition for placing the CEM device into a high-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device that may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott transition criterion for the low-impedance state to high-impedance state transition at current $I_{MI}$ as a threshold voltage VIE is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

In expression (2), $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{IF}}\right)^3 \quad (3)$$

-continued
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{IF}(V_{MI})}\right)^3$$

In expression (3), $A_{CEM}$ corresponds to a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant species, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+(e.g., $Ni^{2+}$ in a material, such as $NiO:CO$ or $NiO:NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits a nickel-based CEM to return to a relatively low-impedance state.

In embodiments, depending on a molecular concentration of $NiO:CO$ or $NiO:NH_3$, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of an electron back-donating material, such as $NiO:CO$ or $NiO:NH_3$ and other materials present in the CEM device, as well as other process variations, and claimed subject matter is not limited in this respect.

Figure 1B:
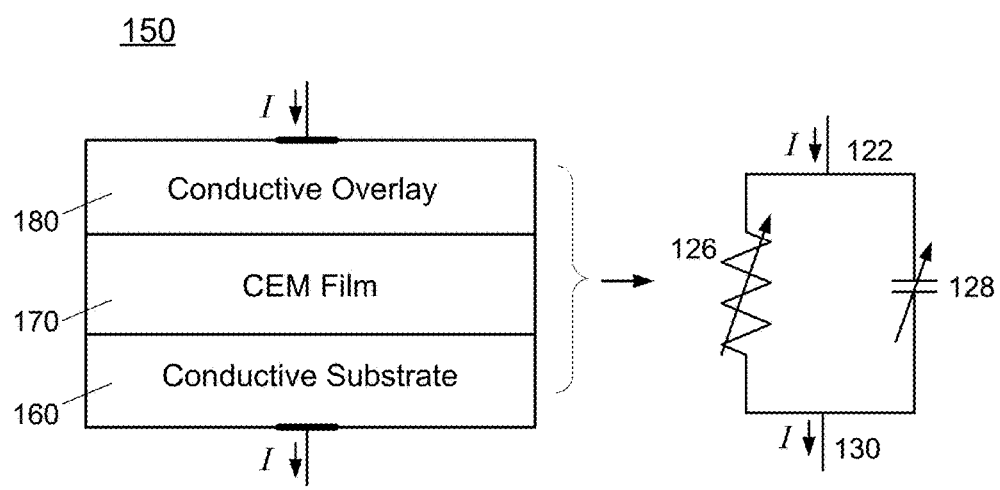
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a conductive substrate 160, CEM film 170, and conductive overlay 180, may depend, at least in part, on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as the device of embodiment 150, may comprise a substantially homogenous CEM film and claimed subject matter is not limited in this respect.

Table 1 below depicts an example truth table for an example variable impedance device, such as the device of embodiment 150.

TABLE 1

| Correlated Electron Switch Truth Table | | |
|---|---|---|
| Resistance | Capacitance | Impedance |
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM device.

In certain embodiments, atomic layer deposition may be utilized to form or to fabricate films comprising NiO materials, such as $NiO:CO$ or $NiO:NH_3$. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness of a single atom, which may comprise a thickness of a fraction of an angstrom (e.g., 0.6 Å). However, a layer encompasses a sheet or coating having a thickness greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance state. Also during operation in a circuit environment, for example, electron back-donation may be reversed to give rise to a substantially dissimilar impedance state, such as a high-impedance state, for example.

Also in this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, a conductive substrate, such as conductive substrate 160, for example, may operate to convey an electrical current to a CEM film in contact with conductive substrate 160. In another example, a substrate may operate to insulate a CEM film to prohibit electrical current flow to or from the CEM film. In one possible example of an insulating substrate, a material such as silicon nitride (SiN) may be employed to insulate components of semiconductor structures. Further, an insulating substrate may comprise other silicon-based materials such as silicon-on-insulator or silicon-on-sapphire technology, doped and/or undoped semiconductors, epitaxial layers of silicon supported by a base semiconductor foundation, conventional metal oxide semiconductors (e.g., a CMOS front end with a metal back end, and/or other semiconductor structures and/or technologies, including CES devices. Accordingly, claimed subject matter is intended to embrace a wide variety of conductive and insulating substrates without limitation.

In particular embodiments, formation of CEM films on or over a substrate may utilize two or more precursors to deposit components of, for example, NiO:CO or NiO:NH$_3$, or other transition metal oxide, transition metal, or combination thereof, onto a conductive material such as a substrate. In an embodiment, layers of a CEM film may be deposited utilizing separate precursor molecules, AX and BY, according to expression (6a), below:

$$AX_{(gas)} + BY_{(gas)} = AB_{(solid)} + XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6a) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)$_2$ where dmamp=1-dimethylamino-2-methyl-2-propanolate, Bis(pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni (CH$_3$C$_5$H$_4$)$_2$, Nickel dimethylglyoximate (Ni(dmg)$_2$), Nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni (C$_5$(CH$_3$)$_5$)$_2$, and nickel carbonyl (Ni(CO)$_4$), just to name a few examples.

However, in particular embodiments, a dopant comprising an electron back-donating material in addition to precursors AX and BY may be utilized to form layers of a CEM device. An additional dopant ligand comprising an electron back-donating material, which may co-flow with precursor AX, may permit formation of electron back-donating compounds, substantially in accordance with expression (6b), below. In embodiments, a dopant comprising an electron back-donating material, such as ammonia (NH$_3$), methane (CH$_4$), carbon monoxide (CO), or other material may be utilized, as may other ligands comprising carbon or nitrogen or other dopants comprising electron back-donating materials listed above. Thus, expression (6a) may be modified to include an additional dopant ligand comprising an electron back-donating material substantially in accordance with expression (6b), below:

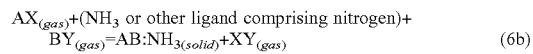

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentrations, of precursors, such as AX, BY, and NH$_3$ (or other ligand comprising nitrogen) of expressions (6a) and (6b) may be adjusted to bring about a final atomic concentration of nitrogen or carbon dopant comprising an electron back-donating material in a fabricated CEM device, such as in the form of ammonia (NH$_3$) or carbonyl (CO) comprising an atomic concentration of between approximately 0.1% and 10.0%. In particular embodiments, atomic concentrations of dopants, such as NH$_3$ and CO, may comprise a more limited range of atomic concentrations such as, for example, between approximately 0.1% and 10.0%. However, claimed subject matter is not necessarily limited to the above-identified precursors and/or atomic concentrations. It should be noted that, claimed subject matter is intended to embrace all such precursors and atomic concentrations of dopants utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices. In expressions (6a) and (6b), "BY" may comprise an oxidizer, such as water (H$_2$O), oxygen (O$_2$), ozone (O$_3$), plasma O$_2$, hydrogen peroxide (H$_2$O$_2$), as previously mentioned. In other embodiments, "BY" may comprise CO, O$_2$+(CH$_4$), or nitric oxide (NO)+water (H$_2$O) or an oxynitride or carbon containing a gaseous oxidizing or oxynitridizing agent. In other embodiments, plasma may be used with an oxidizer (BY) to form oxygen radicals (O*). Likewise, plasma may be used with a doping species comprising an electron back-donating material to form an activated species to control the doping concentration of a CEM.

In particular embodiments, such as embodiments utilizing atomic layer deposition, a substrate, such as a conductive substrate, may be exposed to precursors, such as AX and BY, as well as dopants comprising electron back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:NH$_3$, for example, is performed, chamber temperature ranges of approximately 20.0° C. to 400.0° C. may be utilized. Responsive to exposure to precursor gases (e.g., AX, BY, NH$_3$, or other ligand comprising nitrogen), such gases may be purged from the heated chamber for durations approximately in the range of 0.5 seconds to 180.0 seconds, for example. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, $NH_3$, $CH_4$, or other ligand comprising nitrogen, carbon or other dopant comprising an electron back-donating material, and BY, as described with reference to expression 6(b)) utilizing atomic layer deposition may bring about a layer of a CEM film comprising a thickness approximately in the range of 0.6 Å to 5.0 Å per cycle). Accordingly, in one possible embodiment, if an atomic layer deposition process is capable of depositing layers of a CEM film comprising a thickness of approximately 0.6 Å, 800-900 two-precursor cycles may be utilized to bring about a CEM device comprising a thickness of approximately 500.0 Å. It should be noted that atomic layer deposition may be utilized to form CEM device films having other thicknesses, such as thicknesses approximately in the range of 1.5 nm to 150.0 nm, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other dopant comprising an electron back-donating material and BY), of atomic layer deposition, a CEM device film may undergo in situ annealing, which may permit improvement of film properties or may be used to incorporate a dopant comprising an electron back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In particular embodiments, two or more CEM devices may be formed within a particular layer of an integrated circuit at least in part by atomic layer deposition of a correlated electron material. In a further embodiment, one or more correlated electron switch devices of a first correlated electron switch material and one or more correlated electron switch devices of a second correlated electron switch material may be formed, at least in part, by a combination of blanket deposition and selective epitaxial deposition. Additionally, in an embodiment, first and second access devices may be positioned substantially adjacent to first and second CEM devices, respectively.

In a further embodiment, a CEM device may be positioned within a level of a multilevel integrated circuit to make a first electrical contact with a conductive via located at a level immediately below the CEM device. The CEM device may make a second electrical contact with a conductive via at a level immediately above the CEM device. In this context, a "level," as the term is used herein, means a discrete surface on which a conductive trace or electrically conductive path may be located, wherein the discrete surface is separated from discrete surfaces immediately above and/or immediately below by an intervening CEM and/or by an intervening conductive via. For example, in a three-level integrated circuit, a CEM device may separate a first metal level, located immediately below the level at which the CEM device is positioned, from a second metal level, located immediately above the level at which the CEM device is positioned. In another example, such as in a five-level device, a first metal level may comprise one or more conductive metallic traces. At a second level, a first conductive via may be positioned on or over one or more conductive traces of the first metal level. At a third level, a CEM switching device, for example, may be positioned on a conductive via of the second level. At a fourth level, a second conductive via may be positioned on or over the CEM switching device. At a fifth level, one or more conductive metallic traces may be positioned on the second conductive via. It should be noted that these are merely examples of a wide variety of multilevel circuits, such as integrated circuits, that may comprise a CEM device, and claimed subject matter is not limited in this respect.

In addition, adjacent CEM devices located at a particular level of a multilevel integrated circuit device may be separated from one another by a trench that lies between the adjacent CEM devices. A "spacer" may fill at least a portion of a trench that separates adjacent devices, such as CEM devices, at a particular level of multilevel device. Accordingly, in this context, a "spacer" means a structure that is placed in contact with a CEM device, wherein the spacer operates to insulate or to at least partially isolate adjacent devices from one another, such as CEM devices separated by a trench at a particular level of a multilevel structure. In embodiments, in addition to providing insulation or at least partial isolation from adjacent devices, a spacer operates to control an atomic concentration of a dopant within a CEM device. In particular embodiments, a spacer controls an atomic concentration of the dopant within a CEM device by operating as a seal to reduce migration or diffusion of dopants from CEM devices to adjacent structures, for example. In another example, also as described further herein, a spacer operates to control an atomic concentration of the dopant within a CEM device by replacing or replenishing one or more dopants of a CEM, which may be lost during fabrication operations, such as annealing, for example, that may give rise to diffusion of dopants from a CEM. A spacer, formed in a trench between adjacent CEM devices, may perform additional functions and bring about additional advantages other than those described, and claimed subject matter is not limited in this respect.

Figure 2A:
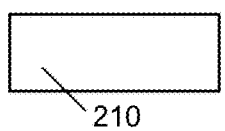
FIGS. 2A-2J illustrate embodiments of sub-processes utilized to fabricate a spacer to control an atomic concentration of a dopant within a CEM device.
Figure 2B:
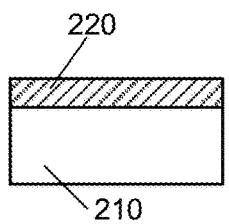

FIGS. 2A-2J illustrate embodiments of sub-processes utilized to fabricate a spacer to control an atomic concentration of a dopant within a CEM device. In FIG. 2A, which corresponds to embodiment 200A, an insulating substrate, such as insulating substrate 210, for example, may comprise SiN having an atomic concentration of at least 90.0%. In embodiments, substrate 210 may be deposited utilizing any suitable process. Suitable processes may include, without limitation, physical vapor deposition (PVD), metal-organic chemical vapor deposition (MOCVD), atomic layer deposition (ALD), and so forth, and claimed subject matter is not limited in this respect. As shown in FIG. 2B (embodiment 200B), after forming insulating substrate 210, which may comprise a thickness of, for example, between 1.0 nm and 25.0 nm, conductive material 220 may be deposited on or over a surface of insulating substrate 210. In embodiment 200B, just as an example, conductive material 220 may comprise Ni; however, in other embodiments, conductive material 220 may comprise any other transition metal, transition metal oxide, and/or any other d-block or f-block element, or alloy thereof, having an atomic concentration of at least 90.0%, for example. Thus, for example, conductive material 220 may comprise TiN or may comprise other d-block or f-block materials, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or alloys thereof, and claimed subject matter is not limited to any particular composition of conductive material 220. In embodiments, conductive material 220 may comprise a thickness less than insulating substrate 210, but may nonetheless comprise a thickness of, for example, between 1.0 nm and 25.0 nm, and claimed subject matter is not limited in this respect.

Figure 2C:
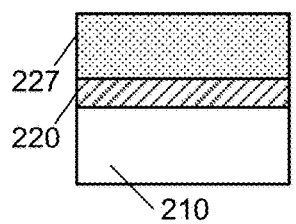

In FIG. 2C, which corresponds to embodiment 200C, CEM 227 may be deposited on or over conductive material 220. In particular embodiments, CEM 227 may be deposited utilizing, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, and claimed subject matter is not limited in this respect.

Figure 2D:
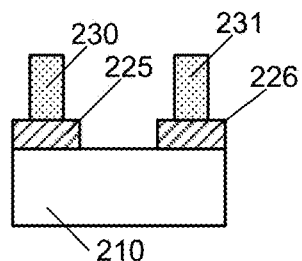
Figure 2E:
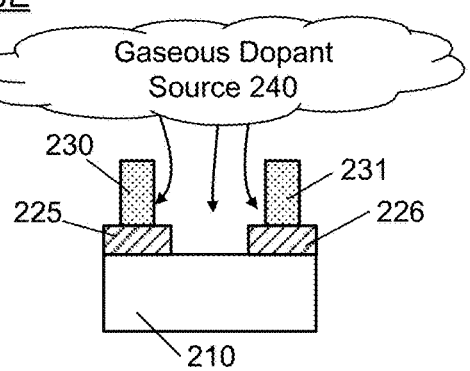

After depositing CEM 227 on or over conductive material 220, CEM material 227 and conductive material 220 may be etched by way of any suitable process, such as processes that utilize patterned photoresist masks, just as an example, and claimed subject matter is not limited in this respect. As shown in FIG. 2D (embodiment 200D), conductive material 220 and CEM 227 may be etched to from conductive trace 225 and conductive trace 226 as well as CEM trace 230 and CEM trace 231. Etching may also form a trench that separates conductive trace 225 and CEM trace 230 from conductive trace 226 and CEM device 231. In embodiment 200D, conductive traces 225 and 226 as well as CEM traces 230 and 231 may extend in two dimensions on the surface of insulating substrate 210.

In particular embodiments, an etching process, such as an etching process to form a trench between conductive traces 225 and 226 and between CEM traces 230 and 231, may give rise to out-diffusion of dopant from within CEM traces 230 and 231. Out-diffusion of dopant from CEM traces may be brought about by etching sub-processes that involve elevated temperatures, for example, and/or exposure of CEM traces to gaseous reagents that may operate to extract dopant molecules within one or more of CEM traces 230. Thus, in particular embodiments, such as embodiment 200E of FIG. 2E, for example, at least some dopant lost as a consequence of etching of CEM traces 230 and 231 may be replaced by exposing a trench separating adjacent CEM devices, such as CEM devices 230 and 231, to gaseous dopant source 240. In particular embodiments, gaseous dopant source 240 may comprise nitrogen, which may operate to control concentration of a dopant within a CEM such as, for example, by replacing a nitrogen and/or other dopant species within CEM traces 230 and 231 lost during, or as a consequence of, an etching process. Accordingly, gaseous dopant source 240 may comprise $N_2O$ (nitrous oxide) and/or NO (nitric oxide), or other nitrogen-containing gaseous material, and claimed subject matter is not limited in this respect. In embodiments, CEM traces 230/231 may be exposed to gaseous dopant source 240 for a duration approximately in the range of 0.5 minutes to 180.0 minutes, for example, and claimed subject matter is not limited in this respect.

Figure 2F:
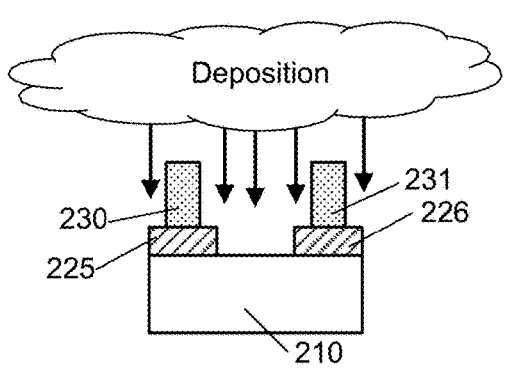

After exposure to gaseous dopant source 240, fabrication of a spacer to control an atomic concentration of a dopant within a CEM trace may continue at FIG. 2F (embodiment 200F). In embodiments, spacer material 235 may be deposited in a trench located between adjacent conductive traces, such as conductive traces 225 and 226, and between CEM traces, such as CEM traces 230 and 231. Any suitable deposition process may be utilized to form spacer material 235, such as atomic layer deposition, chemical vapor deposition, plasma enhanced chemical vapor deposition, plasma enhanced atomic layer deposition, and gas cluster ion beam deposition, for example, and claimed subject matter is not limited in this respect.

In particular embodiments, such as embodiment 200F (FIG. 2F) it may be advantageous to initiate a deposition process utilizing a relatively high concentration of a gaseous nitrogen-containing material, such as $NH_3$, which may operate to form an accumulation of nitrogen near exposed surfaces of CEM trace 230 and 231. In certain embodiments, a gaseous nitrogen-containing material may be supplemented with a carbon component, in which a ratio of carbon components to nitrogen components of the gaseous material may be adjusted by controlling a process chamber temperature or by adjusting other process control values. Accordingly, by utilizing a nitrogen-containing material supplemented with a carbon component, a deposition process may be initiated in which carbon and/or nitrogen are permitted to accumulate on exposed surfaces of the CEM traces 230 and 231. Additionally, carbon and/or nitrogen accumulated on exposed surfaces of CEM traces may be permitted to diffuse into CEM traces 230 and 231 by annealing, using, for example, a temperature approximately in the range of 100.0° C. to 800.0° C. for a duration varying from approximately 1.0 seconds to 5.0 hours. However, in particular embodiments, differing temperature ranges and/or durations may be utilized, and claimed subject matter is not limited in this respect.

Figure 2G:
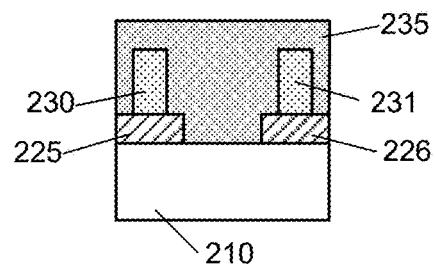

In embodiments, after providing an initial accumulation of carbon and/or nitrogen on exposed surfaces of CEM traces 230 and 231, formation of spacer material 235 may continue with deposition of materials to form the bulk of spacer material 235, such as shown in FIG. 2G (embodiment 200G). In particular embodiments, silicon precursors that include both nitrogen and carbon components may be deposited to form spacer material 235. For example, in certain embodiments, spacer material 235 may be formed by depositing trimethylsilane, bis-trimethyl silylmethane (BTMSM), bis(dimethylamino)dimethylsilane, bis(tertiarybutyl amino) silane, bis(diethylamino)silane), tris(dimethylamino)silane or tetraethoxysilane (TEOS), or a combination thereof. In addition to organic precursors indicated above, silane, disilane, trisilane, and dichlorosilane may be utilized with $NH_3$ to form non-carbon-containing SiN and a ratio of a silicon source to $NH_3$ may be utilized to control an amount of nitrogen present in a precursor. It should be noted that additional precursors may be utilized to deposit a nitrogen-containing spacer material 235, and claimed subject matter is not limited in this respect.

In other embodiments, spacer material 235 may be formed from a material comprising at least 50.0% silicon oxide (SiO) formed from the carbon-containing precursors identified above (e.g., trimethylsilane, bis-trimethylsilylmethane (BTMSM), bis(dimethylamino)dimethylsilane, bis (tertiarybutylamino) silane, bis(diethylamino)silane), tris (dimethylamino)silane)) just to name a few examples, and claimed subject matter is not limited in this respect. For the formation of a SiO spacer material, an oxidizer may be utilized, such as $O_3$, $O_2$, plasma oxygen (O*), and/or $H_2O$, for example, and claimed subject matter is not limited in this respect. In embodiments, exposure to an oxidizer may give rise to formation of carbon-containing molecular dopants (e.g., CO), which may diffuse into one or more of CEM traces 230 to replenish dopant lost during, or as a consequence of, an etching processes. In particular embodiments, spacer material 235 may operate to replenish dopant lost (e.g., by way of out-diffusion from CEM traces 230 and 231), to an atomic concentration approximately in the range of 0.1% to 10.0%.

In particular embodiments, an etching process may give rise to loss of, for example, less than a threshold amount of dopant from one or more of a CEM traces 230 and 231. In one possible example, just to illustrate, an etching process may reduce an atomic concentration of a dopant within one or more of the CEM traces 230 and 231 from for example, 10.0% to 8.0%. However, although a dopant concentration of, for example, 8.0% may represent sufficient dopant within a CEM trace to permit satisfactory operation of CEM devices utilizing CEM traces 230 and 231, it may nonetheless be desirable to control an atomic concentration of dopant within CEM traces 230 and 231 to reduce or preclude further loss of dopant. Accordingly, in certain embodiments, spacer material 235, which may be formed between adjacent CEM traces, may operate as a barrier or seal, which may reduce out-diffusion of a dopant from a CEM trace.

Thus, in particular embodiments, spacer material 235 may comprise a sealing material, such as a material comprising at least 50.0% silicon oxynitride (SiON) or SiN, which may reduce out-diffusion of carbon or other molecular dopant species. In one or more embodiments, spacer material 235 may comprise aluminum oxide ($AL_2O_3$), which may be formed from organic precursors, such as trimethylaluminum (TMAI). In embodiments, use of trimethylaluminum may represent a barrier material that may be deposited at a uniform thickness within a trench, such as a trench formed between CEM traces 230 and 231 and between conductive traces 225 and 226, for example. In embodiments, a barrier material may fill a separation between adjacent CEM traces of between 1.0 nm and 25.0 nm.

Figure 2H:
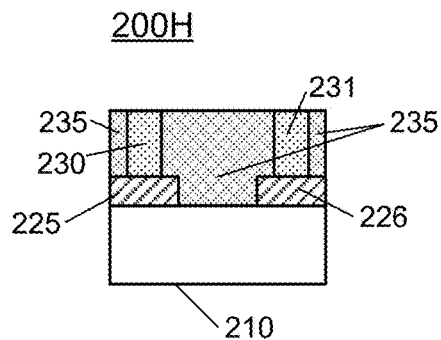
Figure 2I:
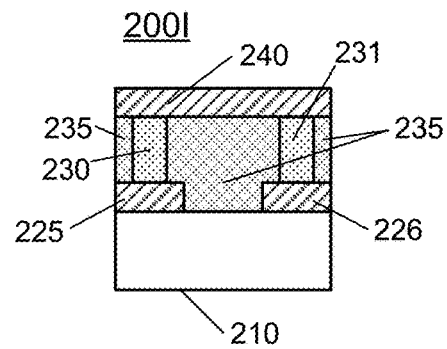

After formation of spacer material 235, which may operate to replenish dopant lost from one or more of CEM traces 230 and 231 and/or to seal dopant within one or more of CEM traces 230 and 231, chemical-mechanical planarization (CMP) may be performed. In embodiments, CMP may operate to remove excess portions of spacer material 235, such as shown in FIG. 2H (embodiment 200H). Accordingly, CEM traces 230 and 231 as well as spacer material 235 may form a substantially planar surface. In embodiments, after CMP, conductive material 240 may be deposited on or over CEM traces 230 and 231 and spacer material 235 as shown in FIG. 2I (embodiment 200I). In embodiment 200I, just as an example, conductive material 240 may comprise Ni; however, in other embodiments, conductive material 240 may comprise any other transition metal, transition metal oxide, and/or any other d-block or f-block element, or alloy thereof, having an atomic concentration of at least 90.0%, for example. In embodiments, conductive material 240 may comprise a thickness similar to that of conductive material 220 of embodiment 200B (FIG. 2B), for example.

Figure 2J:
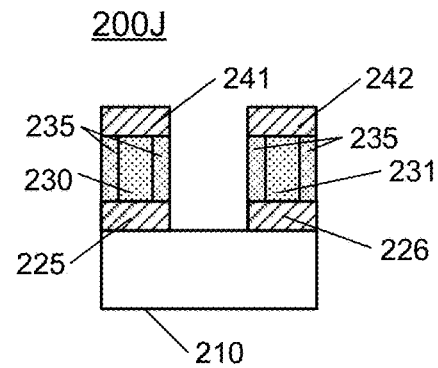

After formation of conductive material 240 on or over spacer material 235 and CEM devices 230, a portion of conductive material 240 and at least a portion of spacer material 235 may be etched away to form, for example, two or more CEM switching devices. As shown in FIG. 2J (embodiment 200J) a first CEM switching device may comprise a lower electrode formed from conductive trace 225, CEM material 230, and conductive trace 241 (formed from conductive material 240). A second CEM switching device may comprise a lower electrode formed from conductive trace 226, CEM material 231, and conductive trace 242 (also formed from conductive material 240.) Spacer material 235 is shown in FIG. 2J as being in contact with CEM traces 230 and 231, which may permit the spacer material to replenish dopant diffused from CEM traces 230 and 231 and/or to operate as a barrier to seal dopant within CEM traces 230 and 231. Spacer material 235 may perform additional functions, and claimed subject matter is not limited in this respect.

It should be noted that the structure of FIG. 2J may represent but one example of a three-level device utilizing one or more spacers to control dopant concentration in CEM materials. In another embodiment, a structure similar to that of FIG. 2J may utilize conductive vias in place of conductive traces 225 and 226 and in place of conductive traces 241 and 242. Accordingly, such an embodiment may represent another example of a multilevel device, in which a conductive via, located at a first metal level, for example, makes electrical contact with a CEM device, located at a second level. The CEM device, located at a second level, may make contact with a conductive via located at a third level located immediately above the CEM device.

Figure 3:
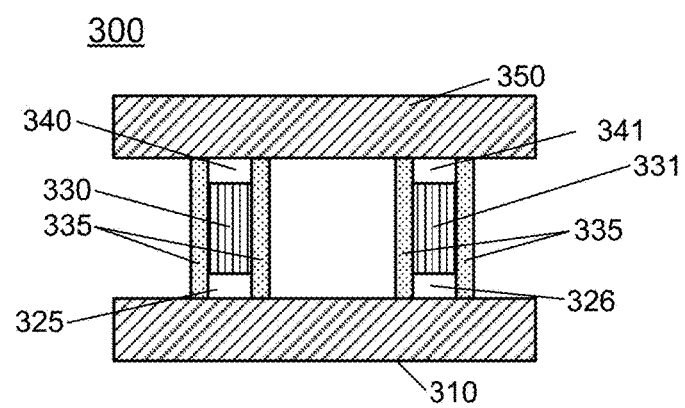
FIG. 3 illustrates an embodiment of a CEM device utilizing spacers to control concentration of a dopant within a CEM device.

FIG. 3 illustrates an embodiment of a CEM device utilizing spacers to control concentration of a dopant within a CEM device. As shown in FIG. 3 (embodiment 300), CEM trace 330, which may be similar to CEM trace 230 of FIG. 2D, may be located between conductive traces 325 and conductive traces 340. Similarly, CEM trace 331, which may be similar to CEM trace 231 of FIG. 2D, for example, may be located between conductive traces 326 and conductive traces 341. Insulating substrate 310, which may comprise a material similar to insulating substrate 210, of embodiment 200A, for example, may be located under conductive traces 325 and 326, and insulating material 350 may be located on or over spacer 335 and conductive traces 340 and 341. In embodiments, conductive traces 325 and 326 may be similar to a conductive traces 225 and 226, as shown in FIG. 2D, for example. Further, conductive traces 340 and 341 may be similar to conductive traces 240 and 241 of FIG. 2D. In embodiment 300, spacer material 335, which may be similar to spacer material 235 (of FIG. 2D) may be shown as being in contact with CEM material 330, conductive traces 325 and 326, as well as conductive material 340 and 341. In embodiments, spacer material 335 may therefore provide protection and/or of conductive materials as well as replenishing and/or sealing dopant within the CEM material. Spacer material may perform additional functions, and claimed subject matter is not limited in this respect.

The structure of FIG. 3 may represent but one example of a five-level device utilizing CEM traces and conductive traces in contact with spacers to control dopant concentration in CEM materials. Accordingly, a multilevel device may comprise insulating substrate 310 and a first level, which may include one or more metallic conductors within insulating substrate 310, for example. A multilevel device may comprise a second level, which may include conductive traces 325 and 326 or conductive vias to transport electrical current from one or more metallic conductors within insulating substrate 310 to CEM traces 330 and 331. At third level, CEM traces 330 and 331 may operate to provide switching between high impedance states and low impedance states. A fourth level of a multilevel device may include conductive traces 340 and 341 or conductive vias to transport electrical current from CEM traces 330 and 331 to or from one or more metallic conductors within insulating material 350, which may comprise a sufficient level of a multilevel CEM device.

Figure 4:
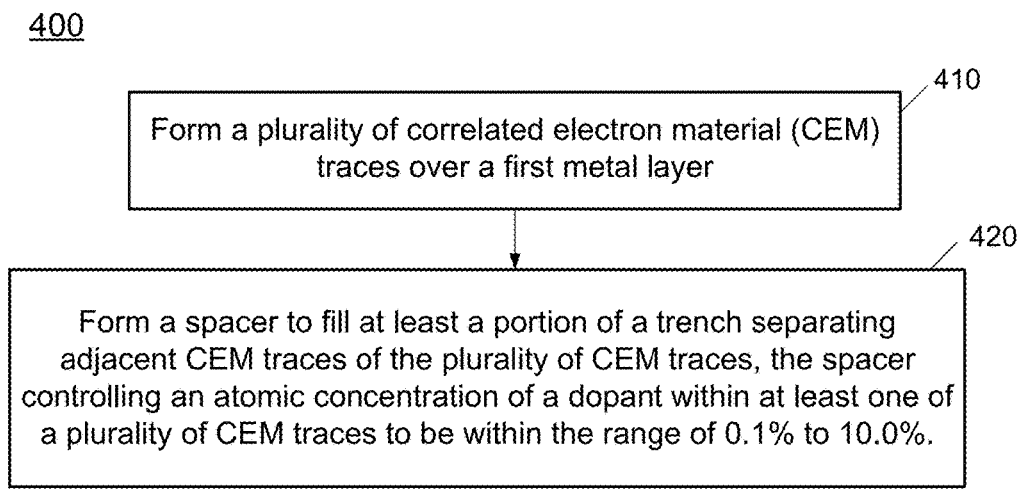
FIG. 4 is a flowchart for a method of constructing a CEM device and spacer according to an embodiment.

FIG. 4 is a flowchart for a method of forming a switching device formed from a correlated electron material according to an embodiment 400. Example implementations, such as described in FIG. 4 may include blocks in addition to those shown and described, fewer blocks, or blocks occurring in an order different than may be identified, or any combination thereof. The method may begin at block 410, which may comprise forming a plurality of CEM traces over a first metal level. In embodiments, CEM traces may be formed from any d-block or f-block, and claimed subject matter is not limited to any particular composition of conductive material. The method may continue at block 420, which may comprise forming a spacer to fill at least a portion of a trench separating adjacent CEM traces of the plurality of CEM traces. In particular embodiments, the spacer may operate to control an atomic concentration of a dopant within at least one of the plurality of CEM traces to be within a range of 0.1% to 10.0%.

In embodiments, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. In addition, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a device, comprising:
   forming a plurality of correlated electron material (CEM) traces over a first level, one or more individual CEM traces of the plurality of CEM traces comprising an electron back-donating material including a dopant; and
   forming a spacer to fill at least a portion of a trench separating adjacent individual CEM traces of the plurality of CEM traces including controlling an atomic concentration of the dopant within the one or more individual CEM traces of the plurality of CEM traces at least in part by enabling diffusion of the dopant from the spacer into the one or more individual CEM traces to thereby impart particular impedance switching characteristics within the one or more individual CEM traces of the plurality of CEM traces.

2. The method of claim 1, wherein the spacer seals the one or more individual CEM traces of the plurality of CEM traces to maintain the atomic concentration of the dopant to be within a range of about 0.1% to about 10.0%.

3. The method of claim 1, wherein forming the spacer comprises depositing aluminum oxide ($Al_2O_3$), silicon nitride (SiN) or silicon oxynitride (SiON), or a combination thereof, in an atomic concentration of at least about 50.0%, into the trench separating the adjacent individual CEM traces of the plurality of CEM traces.

4. The method of claim 3, wherein forming the spacer comprises depositing $Al_2O_3$ responsive to exposure of the trench separating adjacent individual CEM traces of the plurality of CEM traces to trimethylaluminum.

5. The method of claim 1, wherein the spacer is adapted to diffuse the dopant into the one or more individual CEM traces of the plurality of CEM traces to maintain the atomic concentration of the dopant within the one or more individual CEM traces in a range of about 0.1% to about 10.0%.

6. The method of claim 1, further comprising exposing the one or more individual CEM traces of the plurality of CEM traces to nitrous oxide ($N_2O$) or nitric oxide (NO), or a combination thereof, and wherein the spacer is to comprise an atomic concentration of at least about 50.0% of SiN or SiO, or any combination thereof, the spacer to be formed by depositing trimethylsilane, bis(dimethylamino)dimethylsilane, bis(tertiarybutylamino)silane, bis(diethylamino)silane), tris(dimethylamino)silane or tetraethoxysilane (TEOS), or a combination thereof.

7. The method of claim 6, wherein the spacer comprises a concentration of at least about 50.0% SiN, and wherein the method further comprises exposing the trench separating the adjacent individual CEM traces of the plurality of CEM traces to gaseous ammonia ($NH_3$) concurrent with forming the spacer.

8. The method of claim 6, wherein the spacer comprises an atomic concentration of at least about 50.0% SiO, and wherein forming the spacer further comprises exposing the trench separating the adjacent individual CEM traces of the plurality of CEM traces to ozone ($O_3$), oxygen ($O_2$), radical oxygen (O*) or water ($H_2O$) vapor, or a combination thereof.

9. The method of claim 8, further comprising exposing the trench separating the adjacent individual CEM traces of the plurality of CEM traces to nitrous oxide ($N_2O$) or nitric oxide (NO), or combination thereof, prior to forming the spacer.

10. The method of claim 1, wherein the controlling occurs during an etching process performed subsequent to the forming the one or more individual CEM traces of plurality of CEM traces over the first level.

11. The method of claim 1, wherein the one or more individual CEM traces of the plurality of CEM traces comprise the electron back-donating material including the dopant, the dopant comprising carbon or nitrogen or a combination thereof.

12. The method of claim 11, wherein the controlling the atomic concentration of the dopant within the one or more individual CEM traces of the plurality of CEM traces comprises controlling the atomic concentration of the dopant within the one or more individual CEM traces of the plurality of CEM traces to be within the range of about 0.1% to about 10.0% to thereby impart the particular impedance switching characteristics within the one or more individual CEM traces of the plurality of CEM traces.

13. The method of claim 12, wherein the spacer is adapted to enable diffusion of the carbon or nitrogen, or the combination thereof, into the one or more individual CEM traces of the plurality of CEM traces to maintain the range of the atomic concentration of the carbon or nitrogen, or the combination thereof, within the one or more individual CEM traces in a range of about 0.1% to about 10.0%.

14. The method of claim 11, wherein the enabling the diffusion of the dopant from the spacer into the one or more individual CEM traces occurs as part of an etching process performed subsequent to the forming the one or more individual CEM traces of the plurality of CEM traces.

15. The method of claim 1, wherein the forming the plurality of CEM traces over the first level comprises forming the plurality of CEM traces over an electrically conductive material disposed over an insulating substrate.

16. The method of claim 15, wherein the electrically conductive material comprises a transition metal or a transition metal oxide, or an alloy thereof.

17. The method of claim 16, wherein the electrically conductive material comprises Nickel.

18. The method of claim 16, wherein forming the electrically conductive material comprises forming the electrically conductive material to have an atomic concentration of at least 90% of the transition metal or the transition metal oxide, or the alloy thereof.

* * * * *